United States Patent
Kim et al.

(10) Patent No.: US 9,362,116 B2
(45) Date of Patent: Jun. 7, 2016

(54) METHODS OF FORMING OXIDE THIN FILM AND ELECTRICAL DEVICES AND THIN FILM TRANSISTORS USING THE METHODS

(75) Inventors: Hyun Jae Kim, Seoul (KR); Hyun Soo Shin, Seoul (KR); You Seung Rim, Seoul (KR)

(73) Assignee: Indystry-Academic Cooperation Foundation, Yonsei University, Seoul (KR)

(*) Notice: Subject to any disclaimer, the term of this patent is extended or adjusted under 35 U.S.C. 154(b) by 321 days.

(21) Appl. No.: 14/127,690

(22) PCT Filed: Nov. 22, 2011

(86) PCT No.: PCT/KR2011/008928
§ 371 (c)(1),
(2), (4) Date: May 1, 2014

(87) PCT Pub. No.: WO2012/099325
PCT Pub. Date: Jul. 26, 2012

(65) Prior Publication Data
US 2014/0239292 A1    Aug. 28, 2014

(30) Foreign Application Priority Data

Jan. 18, 2011 (KR) .................. 10-2011-0005037
May 9, 2011 (KR) .................. 10-2011-0043493

(51) Int. Cl.
*H01L 21/00* (2006.01)
*H01L 23/58* (2006.01)
*H01L 21/02* (2006.01)
(Continued)

(52) U.S. Cl.
CPC .... *H01L 21/02565* (2013.01); *H01L 21/02422* (2013.01); *H01L 21/02554* (2013.01); *H01L 21/02628* (2013.01); *H01L 29/24* (2013.01);
(Continued)

(58) Field of Classification Search
CPC .................................. H01L 21/02565
USPC .......... 438/796, 785, 768, 660; 257/649, 456, 257/396, E21.347, E21.475, E21.596
See application file for complete search history.

(56) References Cited

U.S. PATENT DOCUMENTS 7,785,706 B2 * 8/2010 Schroeder ......... H01L 21/02381
117/3
7,994,579 B2 * 8/2011 Itai ................................ 257/359

(Continued)

FOREIGN PATENT DOCUMENTS

JP      2010-177431 A    8/2010
KR   10-2009-0011463 A   2/2009

(Continued)

OTHER PUBLICATIONS

Si Joon Kim et al., "Thin Solid Films", vol. 517, 02. 08, Elsevier, 2009.

(Continued)

*Primary Examiner* — Calvin Lee
(74) *Attorney, Agent, or Firm* — Carter, DeLuca, Farrell & Schmit, LLP (57) ABSTRACT

Provided are a method of forming an oxide thin film and an electrical device and thin film transistor using the method. The method includes forming an oxide thin film on a substrate by applying a precursor solution; and performing a thermal treatment process on the substrate under a pressurized atmosphere using a gas at about 100° C. to about 400° C.

17 Claims, 5 Drawing Sheets

(51) Int. Cl.
  *H01L 29/24* (2006.01)
  *H01L 29/49* (2006.01)
  *H01L 29/66* (2006.01)
  *H01L 29/786* (2006.01)

(52) U.S. Cl.
  CPC ...... *H01L 29/4908* (2013.01); *H01L 29/66969* (2013.01); *H01L 29/7869* (2013.01)

(56) References Cited

U.S. PATENT DOCUMENTS

| | | | |
|---|---|---|---|
| 8,025,729 B2 * | 9/2011 | Jurisch | C30B 29/40 117/7 |
| 8,822,350 B2 * | 9/2014 | Yuasa et al. | 438/778 |
| 2008/0057224 A1 * | 3/2008 | Cho et al. | 427/585 |
| 2011/0081137 A1 * | 4/2011 | Masuda | 392/416 |

FOREIGN PATENT DOCUMENTS

| KR | 10-0957013 B1 | 5/2010 |
|---|---|---|
| KR | 10-2010-0079310 A | 7/2010 |
| KR | 10-2010-0112522 A | 10/2010 |

OTHER PUBLICATIONS

International Search Report issued in corresponding application No. PCT/KR2011/008928 mailed Jul. 20, 2012.

International Preliminary Report on Patentability and Written Opinion issued in corresponding application No. PCT/KR2011/008928 issued on Jul. 23, 2013.

Si Joon Kim, et al., "Fabricating gate insulator by low temperature solution-based process", Thin Solid Films 517 (2009) pp. 4135-4137.

* cited by examiner

| Condition | Thermal Treatment Temperature (°C) | Mobility (cm²/Vs) | On-Off Current Ratio | Threshold Voltage (V) | Subthreshold Gate Swing (V/dec.) |
|---|---|---|---|---|---|
| Reference | 350 | 0.66 | 4.9×10⁶ | 3.76 | 0.61 |
| N₂ 5bar | 350 | 2.67 | 8.6×10⁶ | 3.53 | 0.53 |
| N₂ 10bar | 350 | 1.16 | 9.7×10⁶ | 2.74 | 0.56 |
| N₂ 20bar | 350 | 1.07 | 7.5×10⁶ | 3.52 | 0.53 |
| O₂ 5bar | 350 | 2.28 | 4.2×10⁶ | 0.62 | 1.43 |
| O₂ 10bar | 350 | 1.10 | 5.0×10⁶ | 4.46 | 0.59 |
| O₂ 20bar | 350 | 2.6 | 2.2×10⁶ | 3.36 | 0.59 |
| Air 5bar | 350 | 0.34 | 7.1×10⁶ | 6.77 | 0.57 |
| Air 10bar | 350 | 1.25 | 1.6×10⁷ | 1.09 | 0.70 |
| Air 20bar | 350 | 1.05 | 4.2×10⁷ | 3.71 | 0.59 |
| Reference | 300 | 0.003 | 1.4×10⁶ | -0.1 | 0.69 |
| O₂ 5bar | 300 | 0.1 | 1.8×10⁶ | 1.03 | 0.53 |
| O₂ 10bar | 300 | 1.02 | 7.5×10⁶ | 1.58 | 0.48 |
| O₂ 20bar | 300 | 0.42 | 3.8×10⁶ | 1.14 | 0.53 |

METHODS OF FORMING OXIDE THIN FILM AND ELECTRICAL DEVICES AND THIN FILM TRANSISTORS USING THE METHODS

TECHNICAL FIELD

The present invention disclosed herein relates to a semiconductor device, and more particularly, to a method of forming an oxide thin film.

BACKGROUND ART

Recently, an oxide semiconductor has been extensively studied in replacement of a typical silicon based semiconductor. Zinc oxide, indium oxide, and gallium oxide based single, binary and ternary compounds have been reported for the oxide semi-conductor. Besides that, a zinc oxide and tin oxide based binary compound has been studied. For a thin film formation technique using an oxide semiconductor material, various methods such as a vacuum evaporation deposition method, a sputtering method, a chemical vapor deposition method, a spray method, and a solution process method (a sol-gel method) have been studied.

A deposition method using a solution process as an alternative of an expensive vacuum deposition method may not require expensive equipment and is also recognized as promising method for directly forming a thin film as required without an additional patterning process on a large area.

DISCLOSURE OF INVENTION

Technical Problem

However, since a coating material deposited through a solution process is thermally treated at a high temperature of more than about 500° C. it is difficult to deposit a thin film on a glass substrate or a flexible substrate.

The present invention provides a method of forming an oxide thin film having improved characteristics through a thermal treatment process of a low temperature and resolving limitations such as difficult deposition on a glass substrate and a flexible substrate and expensive costs.

Solution to Problem

Embodiments of the present invention provide methods of forming an oxide thin film. The method comprises: forming an oxide thin film on a substrate by applying a precursor solution; and performing a thermal treatment process on the substrate under a pressurized atmosphere using a gas at about 100° C. to about 400° C.

In some embodiments, during the performing of the thermal treatment process, the pressurized atmosphere may be a pressure condition of about 5 bar to about 20 bar.

In other embodiments, during the performing of the thermal treatment process, the gas may include at least one of oxygen, nitrogen, argon, and/or hydrogen.

In still other embodiments, the methods may further include removing remaining organic matters using a vacuum pump before and/or after the thermal treatment process.

In even other embodiments, the vacuum pump may provide a vacuum condition of less than about 1 Torr.

In yet other embodiments, during the performing of the thermal treatment process, a thermal treatment time may be about 5 min to about 180 min.

In further embodiments, the forming of the oxide thin film on the substrate may use a flexible substrate or a glass substrate.

In still further embodiments, the precursor solution may include at least one of zirconium compound, aluminium compound, gallium compound, neodymium compound, chrome compound, cerium compound, yttrium compound, tantalum compound, titanium compound, barium compound, lanthanum compound, manganese compound, strontium compound, hafnium compound, magnesium compound, and/or scandium compound and may form a gate insulation layer of a thin film transistor.

In even further embodiments, the precursor solution may include a first compound (including indium and zinc or tin and zinc) and a second compound (including at least one of zirconium compound, aluminium compound, gallium compound, neodymium compound, chrome compound, cerium compound, yttrium compound, tantalum compound, titanium compound, barium compound, lanthanum compound, manganese compound, strontium compound, hafnium compound, magnesium compound, and/or scandium compound) and may form a channel layer of a thin film transistor.

In other embodiments of the present invention, methods of forming an oxide thin film comprises: forming a first oxide thin film on a substrate by applying a first precursor solution; performing a first thermal treatment process on the substrate under a pressurized atmosphere using a gas at about 100° C. to about 400° C.; a forming a second oxide thin film on the substrate by applying a second precursor solution; and performing a second thermal treatment process on the substrate under a pressurized atmosphere using a gas at about 100° C. to about 400° C.

In some embodiments, the forming of the first oxide thin film may include forming a gate insulation layer of a thin film transistor by using the first precursor including at least one of zirconium compound, aluminium compound, gallium compound, neodymium compound, chrome compound, cerium compound, yttrium compound, tantalum compound, titanium compound, barium compound, lanthanum compound, manganese compound, strontium compound, hafnium compound, magnesium compound, and/or scandium compound.

In other embodiments, the forming of the second oxide thin film may include forming a channel layer of a thin film transistor by using the second precursor including a first compound (including indium and zinc or tin and zinc) and a second compound (including at least one of zirconium compound, aluminium compound, gallium compound, neodymium compound, chrome compound, cerium compound, yttrium compound, tantalum compound, titanium compound, barium compound, lanthanum compound, manganese compound, strontium compound, hafnium compound, magnesium compound, and/or scandium compound).

In still other embodiments, during the performing of the first and second thermal treatment processes, the pressurized atmosphere may be about 5 bar to about 20 bar.

In still other embodiments of the present invention, an electrical device comprises: an oxide thin film formed by applying a precursor solution on a flexible substrate or a glass substrate and performing a thermal treatment process at about 100° C. to about 400° C. under a pressurized atmosphere using a gas.

In even other embodiments of the present invention, a thin film transistor comprises: an oxide thin film formed by applying a precursor solution on a substrate and performing a thermal treatment process at about 100° C. to about 400° C. under a pressurized atmosphere using a gas; a gate electrode formed on the substrate; and a source electrode and a drain electrode formed on the gate electrode.

In some embodiments, the oxide thin film may be formed on the gate electrode and may form a gate insulation layer by using a precursor solution including at least one of zirconium compound, aluminium compound, gallium compound, neodymium compound, chrome compound, cerium compound, yttrium compound, tantalum compound, titanium compound, barium compound, lanthanum compound, manganese compound, strontium compound, hafnium compound, magnesium compound, and/or scandium compound.

In other embodiments, the oxide thin film may be formed on the gate electrode and may form a channel layer by using a precursor solution including a first compound (including indium and zinc or tin and zinc) and a second compound (including at least one of zirconium compound, aluminium compound, gallium compound, neodymium compound, chrome compound, cerium compound, yttrium compound, tantalum compound, titanium compound, barium compound, lanthanum compound, manganese compound, strontium compound, hafnium compound, magnesium compound, and/or scandium compound).

In still other embodiments, the oxide thin film may comprise: a first oxide thin film forming a gate insulation layer by using a precursor solution including at least one of zirconium compound, aluminium compound, gallium compound, neodymium compound, chrome compound, cerium compound, yttrium compound, tantalum compound, titanium compound, barium compound, lanthanum compound, manganese compound, strontium compound, hafnium compound, magnesium compound, and/or scandium compound; and a second oxide thin film forming a channel layer by using a precursor solution including a first compound (including indium and zinc or tin and zinc) and a second compound (including at least one of zirconium compound, aluminium compound, gallium compound, neodymium compound, chrome compound, cerium compound, yttrium compound, tantalum compound, titanium compound, barium compound, lanthanum compound, manganese compound, strontium compound, hafnium compound, magnesium compound, and/or scandium compound).

In even other embodiments, the substrate may be a flexible substrate or a glass substrate.

Advantageous Effects of Invention

A method of forming an oxide thin film according to embodiments of the present invention and an electrical device using the method have the following effects.

According to an embodiment of the present invention, an oxide semiconductor is formed using a solution at a low temperature of less than about 350° C., so that a device may be formed on a glass substrate or a flexible substrate.

Additionally, an electrical device having excellent electrical characteristics such as high field effect mobility, a high on/off ratio, and excellent on/off current characteristic may be formed at a manufacturing temperature of less than about 350° C. on the basis of indium, gallium, and zinc.

BRIEF DESCRIPTION OF DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

BEST MODE FOR CARRYING OUT THE INVENTION

Embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the drawings, the dimensions of layers and regions are exaggerated for clarity of illustration. It will also be understood that when a layer (or film) is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Additionally, when a portion is referred as being "entirely" on another portion, it may be on an entire surface of the another portion or it may not cover a portion of the edge of the another portion.

A method of forming an oxide thin film according to an embodiment of the present invention may form an oxide thin film through a solution process. The solution process may be easy for a large area process, may be applied to a flexible substrate, and may have a less complex manufacturing process. Additionally, since a solution based oxide thin film is formed through a thermal treatment process of a low temperature under a pressurized atmosphere using a gas, a method of forming an oxide thin film without typical limitations and an electrical device and thin film transistor using the method may be provided.

Moreover, an oxide thin film formed through an oxide thin film forming method according to an embodiment of the present invention may form a gate insulation layer and/or a channel layer of a thin film transistor.

For this, a method of forming an oxide thin film according to an embodiment of the present invention may include forming an oxide thin film on a substrate by applying a precursor solution and performing a thermal treatment process on the substrate at about 100° C. to about 400° C. under a pressurized atmosphere using a gas.

Hereinafter, a method of forming an oxide thin film according to an embodiment of the present invention and an electrical device and transistor using the method will be described with reference to the drawings.

Figure 1:
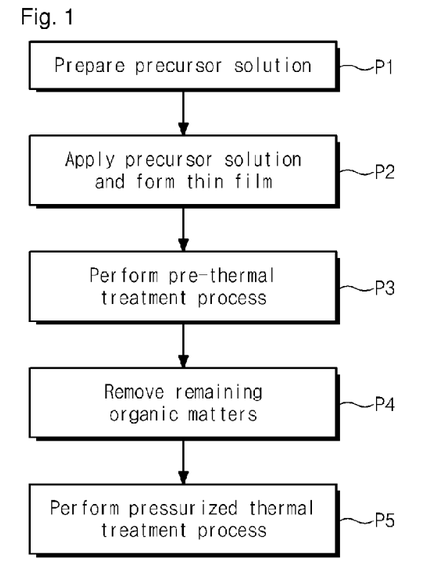
FIG. 1 is a flowchart illustrating a method of forming an oxide thin film including a low temperature pressurized thermal treatment process.

FIG. 1 is a flowchart illustrating a method of forming an oxide thin film including a low temperature pressurized thermal treatment process.

As shown in FIG. 1, the method of forming an oxide thin film includes preparing a precursor solution in operation P1, applying the precursor solution and forming an oxide thin film in operation P2, performing a pre-thermal treatment process on the thin film in operation P3, removing a remaining organic matter through purging after the pre-thermal treatment process in operation P4, and performing a thermal treatment process using a gas under a predetermined pressure condition of a pressurized atmosphere in operation P5.

During the preparing of the precursor solution in operation P1, the precursor solution may include a precursor solution for forming a channel layer of a thin film transistor and/or a precursor solution for forming a gate insulation layer. The precursor solution for forming a channel layer of a thin film transistor may be an inorganic salt precursor of metal nitride and/or metal acetate. The precursor solution for forming a channel layer of a thin film transistor may include a zinc and gallium based material, and may further include a material including indium and/or tin based materials.

In more detail, the precursor solution for forming a channel layer of a thin film transistor may be prepared by mixing a dispersoid and a dispersion medium corresponding thereto. The dispersoid includes a first compound (including indium and zinc or tin and zinc) and a second compound (including at least one of zirconium compound, aluminium compound, gallium compound, neodymium compound, chrome compound, cerium compound, yttrium compound, tantalum compound, titanium compound, barium compound, lanthanum compound, manganese compound, strontium compound, hafnium compound, magnesium compound, and/or scandium compound). Moreover, the precursor solution for forming a channel layer of a thin film transistor is prepared through stirring and aging.

Each mole ratio of the tin compound, zinc compound (or indium compound, zinc compound) to zirconium compound aluminium compound, gallium compound, neodymium compound, chrome compound, cerium compound, yttrium compound, tantalum compound, titanium compound, barium compound, lanthanum compound, manganese compound, strontium compound, hafnium compound, magnesium compound, and/or scandium compound may be in a range of 1:0.1~1.

The dispersion medium used for forming the dispersion system may include at least one selected from the group consisting of isopropanol, 2-methoxyethanol, dimethyl-formamide, ethanol, deionized water, methanol, acethylacetone, dimethylamineborane, and/or acetonitrile, depending on the dispersoid The precursor solution for forming a gate insulation layer of a thin film transistor may be prepared by mixing a dispersoid and a dispersion medium corresponding thereto. The dispersoid may include at least one of zirconium compound, aluminium compound, gallium compound, neodymium compound, chrome compound, cerium compound, yttrium compound, tantalum compound, titanium compound, barium compound, lanthanum compound, manganese compound, strontium compound, hafnium compound, magnesium compound, and/or scandium compound. Moreover, the precursor solution for forming a gate insulation layer of a thin film transistor is prepared through stirring and aging.

The dispersion medium used for forming the dispersion system may include at least one selected from the group consisting of isopropanol, 2-methoxyethanol, dimethyl-formamide, ethanol, deionized water, methanol, acethylacetone, dimethylamineborane, and/or acetonitrile, depending on the dispersoid.

The preparing of the precursor solution in operation P1 may be performed through a sol-gel method, a metal organic decomposition method, a nano-particle dispersion solution method, and/or a chemical bath deposition method. Among them, the sol-gel method does not require expensive equipment so that manufacturing costs may be minimized. Additionally, manufacturing processes are simple so that manufacturing time may be reduced.

During the applying of the precursor solution and the forming of the oxide thin film on the substrate in operation P2, the substrate is not limited to a specific one. For example, silica or plastic may be appropriately selected and used for the substrate according to the purpose but the present invention is not limited thereto. A glass substrate or a flexible substrate may be used.

A coating process for a thin film may be performed through dip coating, spin coating, and/or spray coating. Especially, in relation to the spin coating, a coating layer with a uniform thickness may be obtained due to centrifugal force and its thickness may be adjusted.

The substrate with a thin film goes through the pre-thermal treatment process in operation P3 at about 300° C. at which an organic solvent may be evaporated through a heating means.

Hereinafter, the performing of the thermal treatment process at a temperature range of about 100° C. to about 400° C. under a pressurized atmosphere using a gas will be described in more detail.

First, a coated substrate is loaded into preheated equipment according to a temperature condition of about 100° C. to about 400° C. Top and bottom chambers are combined through metal sealing. The metal sealing prevents distortion at a high temperature of more than about 300° C. through metal nuts. Then, the removing of the organic residues after the pre-thermal treatment process is performed through 5 min purging under a vacuum condition in operation P4. At this point, a vacuum condition of less than about 1 Torr may be provided through a vacuum pump.

Then, the pressurized thermal treatment process for forming pressures of about 5, 10, and/or 20 bars by using a predetermined amount of a gas through a mass flow controller (MFC) and performing a thermal treatment process for a predetermined time is performed in operation P5. The pressurized thermal treatment process may reduce manufacturing time more than a typical process for forming an oxide thin film. Additionally, the density of the oxide thin film is improved by removing bubbles therein. At this point, a thermal treatment time may be about 5 min to about 180 min. Gas for forming pressure may include at least one of oxygen, nitrogen, argon, and/or hydrogen.

According to another aspect of the present invention, provided is an electrical device including an oxide thin film formed when a thermal treatment process at about 100° C. to about 400° C. under a pressurized atmosphere is performed using a gas after a precursor solution is applied on a flexible substrate or a glass substrate.

According to another aspect of the present invention, provided is a thin film transistor, which includes an oxide thin film formed when a thermal treatment process at about 100° C. to about 400° C. under a pressurized atmosphere is performed using a gas after a precursor solution is applied on a substrate, a gate electrode formed on the substrate, and source and drain electrodes formed on the gate electrode.

Figure 2:
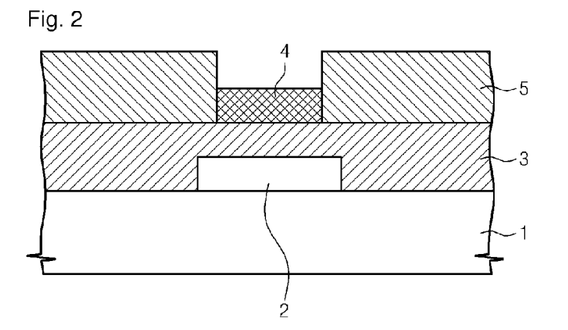
FIG. 2 is a sectional view illustrating a field effect transistor having a bottom gate structure according to an embodiment of the present invention.

FIG. 2 is a sectional view illustrating a field effect transistor having a bottom gate structure according to an embodiment of the present invention. As shown in FIG. 2, the field effect transistor may include a glass substrate 1, a gate electrode layer 2, a gate insulation layer 3, a channel layer 4, and a source-drain electrode layer 5.

Hereinafter, characteristic improvements of a field effect transistor, where an oxide thin film formed using a method of forming an oxide thin film through a low temperature pressurized thermal treatment process forms the channel layer 4, will be described in more detail through an embodiment 1.

[Embodiment 1]

A sol-gel method is used for forming an oxide thin film on a substrate. 2-methoxyethanol was used as a solvent and indium nitrate hydrate and zinc acetate dehydrate were used as a precursor material. Mono-ethanolamine and $CH_3COOH$ were used as a solution stabilizer. Indium, gallium and zinc (5:1:2 mole ratio) were added into solvent 2-methoxyethanol as to form 0.2M. Then, in order to stabilize the sol, mono-ethanolamine and $CH_3COOH$ were mixed with an appropriate ratio. A hot plate temperature were about 70° C. and resulting solution were agitated for about 30 min at a speed of about 300 rpm by using a magnetic bar. A substrate sample was prepared. An Eagle 2000™ glass were used as the substrate sample with a $SiO_2$ buffer layer, a gate electrode of MoW, and a $SiO_2$ gate insulating layer on the gate electrode. In order to remove organic matters and impurities on the surface of the substrate sample, each ultrasonic cleaning were performed for 20 min in an order of acetone, methanol, and DI-water. For uniform deposition, after an ultrasonic cleaning were performed in a NaOH solution for 10 min, DI-water was used several times for cleaning during the thin film coating. The cleaned substrate were prepared by performing blurring with $N_2$ gas. The thin film coating was performed through a spin-coating method in the 5 levels of about 500 rpm 10 sec, about 1500 rpm 10 sec, about 3000 rpm 10 sec, about 1500 rpm 10 sec, and about 500 rpm 10 sec. The coated substrate was thermally treated for about 5 min at a hot plate temperature of about 300° C.

Then, a thermal treatment process was performed through the following operations in low temperature pressurized thermal treatment equipment used in the present invention. After the sample substrate was loaded into equipment preheated according to the temperature conditions of about 300° C. and about 350° C., top and bottom chambers were combined through metal sealing. After a pre-thermal treatment process was performed through purging for about 5 min under a vacuum condition of less than about 1 Torr. A 3-hour thermal treatment process was performed through an MFC after about 5, 10, and 20 bar pressures are formed using a predetermined amount of $N_2$, $O_2$, and/or air gases. Aluminium was deposited with about 2000 through sputtering to form a source-drain electrode.

Figure 3:
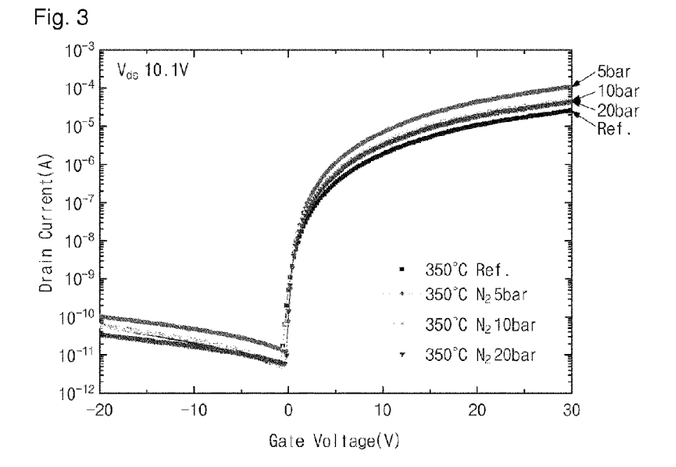
FIG. 3 is a graph illustrating a transfer curve of an indium-gallium-zinc oxide based field effect transistor according to an applied pressure change of $N_2$ at about 350° C.

FIG. 3 is a graph illustrating a transfer curve of an indium-gallium-zinc oxide based field effect transistor according to an applied pressure change of $N_2$ at about 350° C. Here, the reference condition represents a state with no pressure applied. During a typical thermal treatment process at about 350° C., a low mobility of about 0.66 $cm^2/Vs$ was shown under a reference condition, but, during a thermal treatment process of an $N_2$ 5 bar atmosphere, a high mobility of about 2.66 $cm^2/Vs$ was shown, which is four times faster than the reference condition. Additionally, a subthreshold gate swing was reduced from about 0.61 V/dec. to about 0.53 V/dec., so that a switching characteristic becomes better than that of the reference condition. Although a switching characteristic was improved at an applied pressure of about 10 and 20 bar atmospheres, an excellent switching characteristic improvement was shown especially at an appropriate applied pressure of about 5 bar. It is estimated that a defective area at the interface between the solution based oxide thin film and the gate insulation layer was reduced and a bulk density of the thin film was improved due to an applied pressure.

Figure 4:
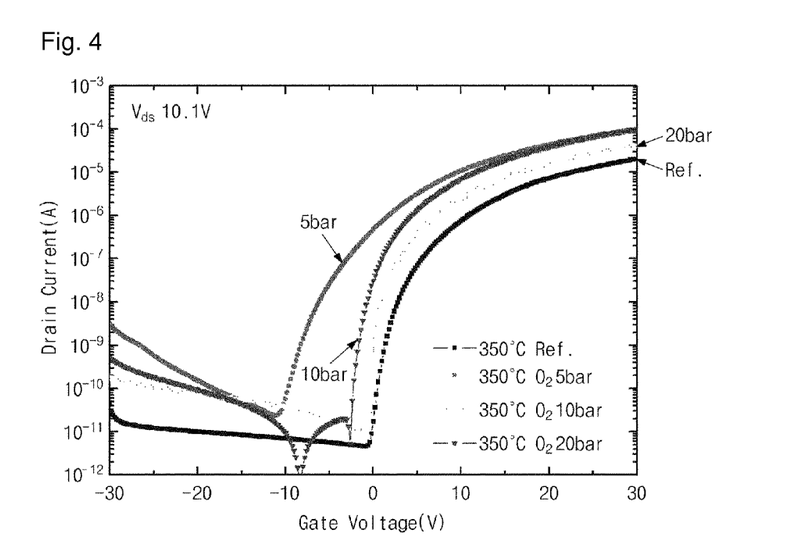
FIG. 4 is a graph illustrating a transfer curve of an indium-gallium-zinc oxide based field effect transistor according to an applied pressure change of $O_2$ at about 350° C.

FIG. 4 is a graph illustrating a transfer curve of an indium-gallium-zinc oxide based field effect transistor according to an applied pressure change of $O_2$ at about 350° C. During a thermal treatment process of an $O_2$ 5 bar atmosphere, a mobility of 2.88 $cm^2/Vs$ was shown, which is three times faster than that of the reference condition. However, unlike the $N_2$ pressurized thermal treatment process, a characteristic change of a device occurred according to a concentration change of carried in the indium-gallium-zinc oxide during the $O_2$ pressurized thermal treatment process.

Figure 5:
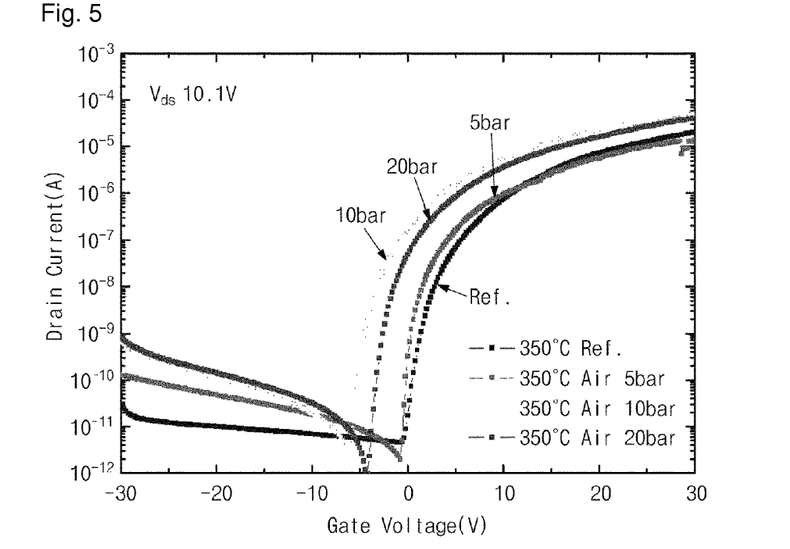
FIG. 5 is a graph illustrating a transfer curve of an indium-gallium-zinc oxide based field effect transistor according to an applied pressure change of air at about 350° C.

FIG. 5 is a graph illustrating a transfer curve of an indium-gallium-zinc oxide based field effect transistor according to an applied pressure change of air at about 350° C. Like the $O_2$ pressurized condition, the electrical characteristic of a device was improved but a characteristic change of a device occurred greatly than that of the $N_2$ pressurized condition.

Figure 6:
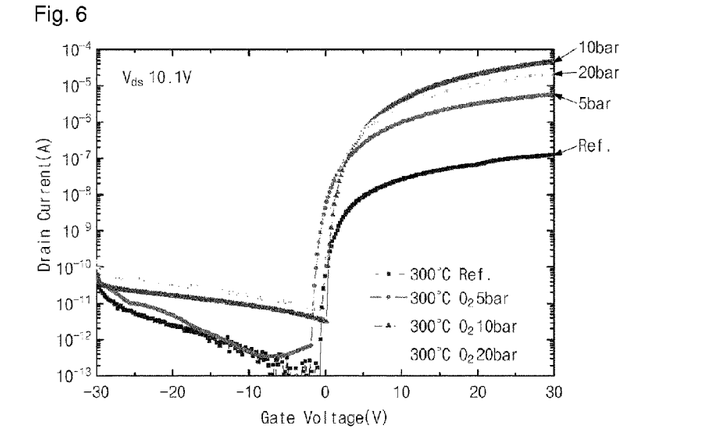
FIG. 6 is a graph illustrating a transfer curve of an indium-gallium-zinc oxide based field effect transistor according to an applied pressure change of $O_2$ at about 300° C.

FIG. 6 is a graph illustrating a transfer curve of an indium-gallium-zinc oxide based field effect transistor according to an applied pressure change of $O_2$ at about 350° C. A characteristic improvement at the temperature condition of about 300° C. was more excellent than that at the temperature condition of about 350° C. Especially, in relation to a mobility changing from 0.003 $cm^2/Vs$ into 1.02 $cm^2/Vs$, characteristics was improved greatly. In relation to a subthreshold gate swing, as it was reduced from about 0.69 V/dec. into about 0.53 V/dec. under the 5 bar pressure condition, a switching characteristic was improved.

Figure 7:
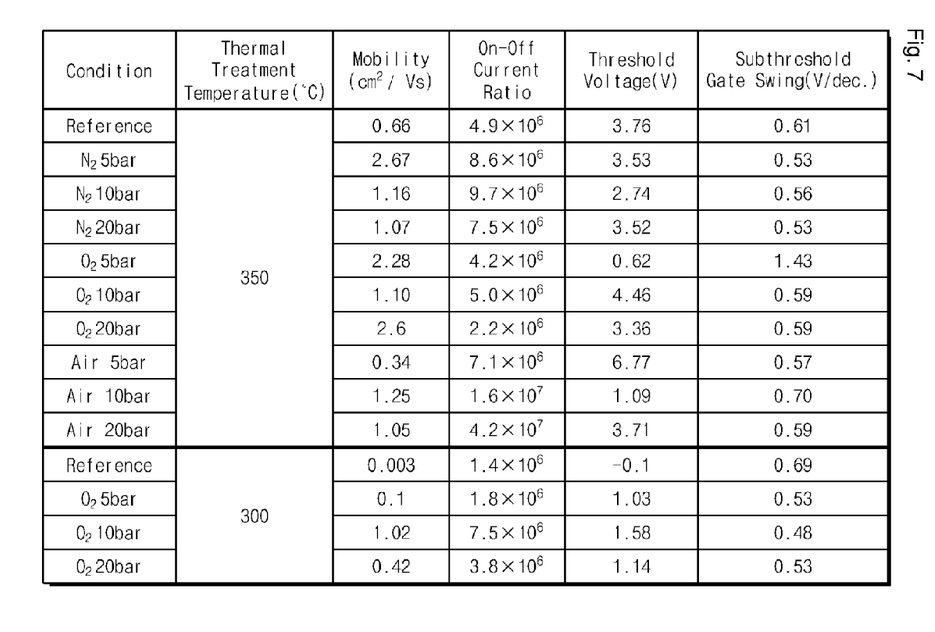
FIG. 7 is a graph illustrating a characteristic change of an indium-gallium-zinc oxide based field effect transistor under the conditions of the thermal treatment temperatures of about 300° C. and about 350° C. and the applied pressures of about 5, 10, and 20 bar.

FIG. 7 is a graph illustrating a characteristic change of an indium-gallium-zinc oxide based field effect transistor under the conditions of the thermal treatment temperatures of about 300° C. and about 350° C. and the applied pressures of about 5, 10, and 20 bar.

Hereinafter, characteristic improvements of a field effect transistor, where an oxide thin film formed through a method of forming an oxide thin film through a low temperature pressurized thermal treatment process forms the gate insulation layer 3, will be described in more detail through an embodiment 2.

[Embodiment 2]

A sol-gel method was used for forming an oxide thin film on a substrate. 2-methoxyethanol was used as a solvent. Mono-ethanolamine and $CH_3COOH$ were used as a solution stabilizer. A zirconium compound was used as a precursor material. Then, in order to stabilize the sol, mono-ethanolamine and $CH_3COOH$ were mixed with an appropriate ratio. A hot plate temperature was about 70° C. and a solution was agitated for about 30 min at a speed of about 300 rpm by using a magnetic bar. The sufficiently agitated solution was aged for about 24 hour for stabilization. Before the prepared solution was coated, a substrate was prepared as a sample in order to form a $SiO_2$ buffer layer on an Eagle 2000™ glass, form a gate electrode of MoW, and grow $SiO_2$ thereon. Here, in relation to the substrate, an $n^+$ silicon wafer was used as a gate electrode. In order to remove organic matters and impurities on the surface, each ultrasonic cleaning was performed for 20 min in an order of acetone, methanol, and DI-water. For uniform deposition, after an ultrasonic cleaning was performed in a NaOH solution for 10 min, DI-water was used several times for cleaning during the thin film coating. The cleaned substrate was prepared by performing blurring with $N_2$ gas. The thin film coating was performed through a spin-coating method in the five levels of about 500 rpm 10 sec, about 1500 rpm 10 sec, about 3000 rpm 10 sec, about 1500 rpm 10 sec, and about 500 rpm 10 sec. The coated substrate was thermally treated for about 5 min at a hot plate temperature of about 300° C.

Then, a thermal treatment process was performed through the following operations in low temperature pressurized thermal treatment equipment used in the present invention. After the sample was loaded into equipment preheated according to temperature conditions of about 300° C. and about 350° C., top and bottom chambers were combined through metal sealing. After a pre-thermal treatment process was performed through purging for about 5 min under a vacuum condition of less than about 1 Torr. A 3-hour thermal treatment process was performed through an MFC after about 10-bar pressure was formed using a predetermined amount of air gas. Lastly, Aluminium is deposited with about 2000 Å through sputtering to form a source-drain electrode.

Figure 8:
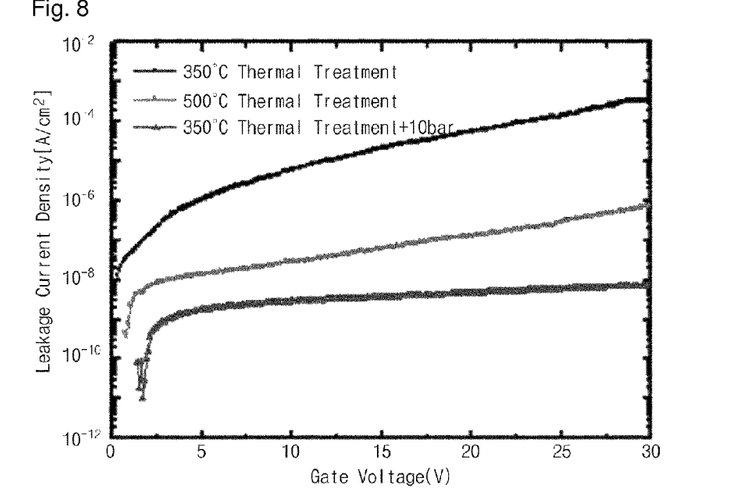
FIG. 8 is a graph illustrating a characteristic change of an MIM structure at an applied pressure of 10 bar air at about 350° C.

FIG. 8 is a graph illustrating a characteristic change of a Metal-gate Insulation layer Metal (MIM) structure at an applied pressure of 10 bar air. As shown in FIG. 8, a leakage current density of a transistor, where an oxide thin film formed under the conditions of a 10 bar air applied pressure and about 350° C. forms a gate insulation layer, was measured as about $7.24 \times 10^{-9}$ $A/cm^2$ (at about 2.22 MV/cm). In relation to the transistor that an oxide thin film formed through a thermal treatment process at about 350° C. forms a gate insulation layer, its leakage current density was measured as about $3.33 \times 10^{-4}$ $A/cm^2$ (at about 1.95 MV/cm). In relation to the transistor that an oxide thin film formed through a thermal treatment process at about 500° C. forms a gate insulation layer, its leakage current density was measured as about $7.97 \times 10^{-7}$ $A/cm^2$ (at about 2 MV/cm). Here, MV/cm represents an intensity of an electric field obtained by dividing the gate voltage 30[V] by a thickness of the thin film. Likewise, if an oxide thin film formed through a thermal treatment process under the conditions of about 350° C. and a 10 bar air atmosphere is used as a gate insulation layer of a transistor, its leakage current density becomes lowered so that a transistor and an electrical device having a lower off current characteristic may be provided.

Figure 9:
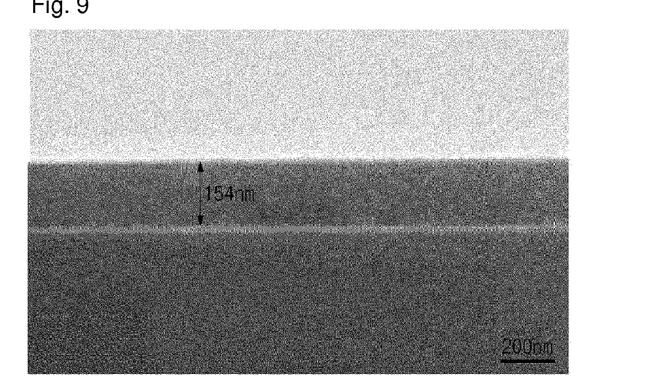
FIGS. 9 to 11 are views illustrating thicknesses of an oxide thin film when thermal treatment processes are respectively performed at about 350° C., about 500° C., and about 350° C. under the 10 bar air applied pressure.
Figure 10:
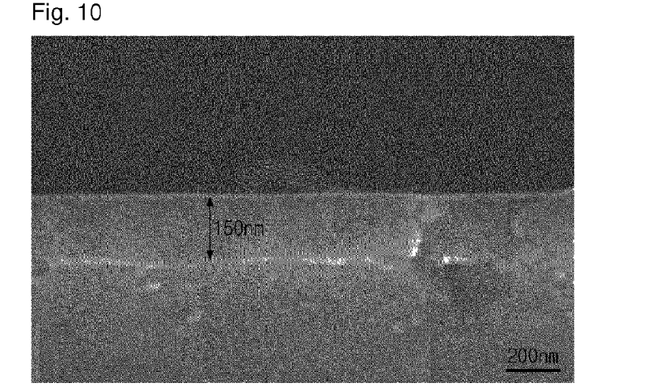
Figure 11:
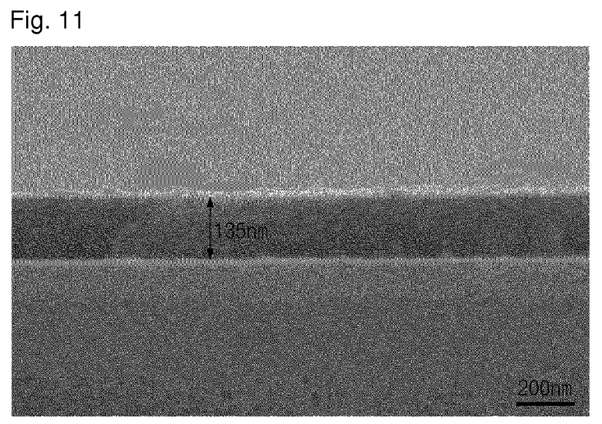

FIGS. 9 to 11 are views illustrating thicknesses of an oxide thin film when thermal treatment processes are respectively performed at about 350° C. about 500° C. and about 350° C. under the 10 bar applied pressure. As shown in FIGS. 9 to 11, when the thermal treatment process is performed at about 350° C. under the 10 bar applied pressure, it is confirmed that the thickness of a thin film is thinnest with about 135 nm. This means that the density of a thin film is improved more when the thin film is deposited through a thermal treatment process under the applied pressure atmosphere than when a deposition temperature is increased. Additionally, the density improvement of the thin film also lowers the leakage current density of a transistor.

Through the drawings, when a thin film formed through a solution based process of a low temperature pressurized thermal treatment process is used as a channel layer or a gate insulation layer of a transistor, it is confirmed that characteristics of the transistor may be improved.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

The invention claimed is:

1. A method of forming an oxide thin film, comprising:
   forming an oxide thin film on a substrate by applying a precursor solution through a solution process method; and
   performing a pressurized thermal treatment process under a pressurized atmosphere using a gas at about 100° C. to about 400° C.,
   wherein during the performing of the pressurized thermal treatment process, the pressurized atmosphere is a pressure condition of about 5 bar to about 20 bar.

2. The method of claim 1, wherein during the performing of the pressurized thermal treatment process, the gas comprises at least one of oxygen, nitrogen, argon, and/or hydrogen.

3. The method of claim 1, wherein during the performing of the pressurized thermal treatment process, a thermal treatment time is about 5 min to about 180 min.

4. The method of claim 1, wherein the substrate comprises a flexible substrate or a glass substrate.

5. The method of claim 1, wherein the forming of the oxide thin film comprises forming a gate insulation layer of a thin film transistor by mixing a dispersoid and a dispersion medium to form a dispersion system, wherein the dispersoid comprises at least one of zirconium compound, aluminium compound, gallium compound, neodymium compound, chrome compound, cerium compound, yttrium compound, tantalum compound, titanium compound, barium compound, lanthanum compound, manganese compound, strontium compound, hafnium compound, magnesium compound, and/or scandium compound.

6. The method of claim 1, wherein the forming of the oxide thin film comprises forming a channel layer of a thin film transistor by mixing a dispersoid and a dispersion medium to form a dispersion system, wherein the dispersoid comprises a first compound comprising indium and zinc or tin and zinc and a second compound comprising at least one of zirconium compound, aluminium compound, gallium compound, neodymium compound, chrome compound, cerium compound, yttrium compound, tantalum compound, titanium compound, barium compound, lanthanum compound, manganese compound, strontium compound, hafnium compound, magnesium compound, and/or scandium compound.

7. The method of claim 1, further comprising removing remaining organic matters using a vacuum pump before and/or after the pressurized thermal treatment process.

8. The method of claim 7, wherein the vacuum pump provides a vacuum condition of less than about 1 Torr.

9. A method of forming an oxide thin film, comprising:
forming a first oxide thin film on a substrate by applying a first precursor solution through a solution process method;
performing a first pressurized thermal treatment process under a pressurized atmosphere using a gas at about 100° C. to about 400° C.;
forming a second oxide thin film by applying a second precursor solution through a solution process method; and
performing a second pressurized thermal treatment process under a pressurized atmosphere using a gas at about 100° C. to about 400° C.,
wherein during the performing of the first and second thermal treatment processes, the pressurized atmosphere is about 5 bar to about 20 bar.

10. The method of claim 9, wherein the forming of the first oxide thin film comprises forming a gate insulation layer of a thin film transistor by mixing a dispersoid and a dispersion medium to form a dispersion system, wherein the dispersoid comprises at least one of zirconium compound, aluminium compound, gallium compound, neodymium compound, chrome compound, cerium compound, yttrium compound, tantalum compound, titanium compound, barium compound, lanthanum compound, manganese compound, strontium compound, hafnium compound, magnesium compound, and/or scandium compound.

11. The method of claim 9, wherein the forming of the second oxide thin film comprises forming a channel layer of a thin film transistor by mixing a dispersoid and a dispersion medium to form a dispersion system, wherein the dispersoid comprises comprising a first compound comprising indium and zinc or tin and zinc and a second compound comprising at least one of zirconium compound, aluminium compound, gallium compound, neodymium compound, chrome compound, cerium compound, yttrium compound, tantalum compound, titanium compound, barium compound, lanthanum compound, manganese compound, strontium compound, hafnium compound, magnesium compound, and/or scandium compound.

12. An electrical device comprising:
an oxide thin film formed by applying a precursor solution through a solution process method on a flexible substrate or a glass substrate, and performing a pressurized thermal treatment process at about 100° C. to about 400° C. under a pressurized atmosphere using a gas,
wherein the pressurized atmosphere is about 5 bar to about 20 bar.

13. A thin film transistor comprising:
an oxide thin film formed by applying a precursor solution through a solution process method on a substrate and performing a pressurized thermal treatment process at about 100° C. to about 400° C. under a pressurized atmosphere using a gas;
a gate electrode formed on the substrate; and
a source electrode and a drain electrode formed on the gate electrode,
wherein the pressurized atmosphere is about 5 bar to about 20 bar.

14. The thin film transistor of claim 13, wherein the oxide thin film is formed on the gate electrode and forms a gate insulation layer by mixing a dispersoid and a dispersion medium to form a dispersion system, wherein the dispersoid comprises at least one of zirconium compound, aluminium compound, gallium compound, neodymium compound, chrome compound, cerium compound, yttrium compound, tantalum compound, titanium compound, barium compound, lanthanum compound, manganese compound, strontium compound, hafnium compound, magnesium compound, and/or scandium compound.

15. The thin film transistor of claim 13, wherein the oxide thin film is formed on the gate electrode and forms a channel layer by mixing a dispersoid and a dispersion medium to form a dispersion system, wherein the dispersoid comprises a first compound comprising indium and zinc or tin and zinc and a second compound comprising at least one of zirconium compound, aluminium compound, gallium compound, neodymium compound, chrome compound, cerium compound, yttrium compound, tantalum compound, titanium compound, barium compound, lanthanum compound, manganese compound, strontium compound, hafnium compound, magnesium compound, and/or scandium compound.

16. The thin film transistor of claim 13, wherein the oxide thin film comprises:
a first oxide thin film forming a gate insulation layer by mixing a dispersoid and a dispersion medium to form a dispersion system, wherein the dispersoid comprises at least one of zirconium compound, aluminium compound, gallium compound, neodymium compound, chrome compound, cerium compound, yttrium compound, tantalum compound, titanium compound, barium compound, lanthanum compound, manganese compound, strontium compound, hafnium compound, magnesium compound, and/or scandium compound; and
a second oxide thin film forming a channel layer by mixing a dispersoid and a dispersion medium to form a dispersion system, wherein the dispersoid comprises a first compound comprising indium and zinc or tin and zinc and a second compound comprising at least one of zirconium compound, aluminium compound, gallium compound, neodymium compound, chrome compound, cerium compound, yttrium compound, tantalum compound, titanium compound, barium compound, lanthanum compound, manganese compound, strontium compound, hafnium compound, magnesium compound, and/or scandium compound.

17. The thin film transistor of claim 13, wherein the substrate comprises a flexible substrate or a glass substrate.

* * * * *